United States Patent
Mailfert et al.

(10) Patent No.: US 9,885,949 B2
(45) Date of Patent: Feb. 6, 2018

(54) METHOD FOR DESIGNING A LITHOGRAPHIC MASK

(71) Applicants: IMEC VZW, Leuven (BE); Katholieke Universiteit Leuven, KU LEUVEN R&D, Leuven (BE)

(72) Inventors: Julien Mailfert, Leuven (BE); Werner Gillijns, Holsbeek (BE)

(73) Assignees: IMEC VZW, Leuven (BE); KATHOLIEKE UNIVERSITEIT LEUVEN, KU LEUVEN R&D, Leuven (BE)

(*) Notice: Subject to any disclaimer, the term of this patent is extended or adjusted under 35 U.S.C. 154(b) by 32 days.

(21) Appl. No.: 15/207,187

(22) Filed: Jul. 11, 2016

(65) Prior Publication Data

US 2017/0017148 A1    Jan. 19, 2017

(30) Foreign Application Priority Data

Jul. 16, 2015 (EP) .................................. 15177048

(51) Int. Cl.
*G03F 1/36* (2012.01)
*G03F 1/70* (2012.01)
*G06F 17/50* (2006.01)

(52) U.S. Cl.
CPC .................. *G03F 1/36* (2013.01); *G03F 1/70* (2013.01); *G06F 17/5081* (2013.01)

(58) Field of Classification Search
CPC ........... G03F 1/36; G03F 1/70; G06F 17/5081
USPC ....................................................... 430/5, 30
See application file for complete search history.

(56) References Cited

U.S. PATENT DOCUMENTS

| | | | |
|---|---|---|---|
| 7,480,890 B2 | 1/2009 | Hsiao | |
| 8,196,068 B2 | 6/2012 | Zhang | |
| 8,413,081 B2 | 4/2013 | Ye et al. | |
| 8,595,657 B2 | 11/2013 | Cha et al. | |
| 8,607,168 B2 | 12/2013 | Kusnadi et al. | |
| 8,619,236 B2 | 12/2013 | Bruce et al. | |
| 8,874,423 B2 | 10/2014 | Cao et al. | |
| 2015/0040078 A1 | 2/2015 | Verma et al. | |

OTHER PUBLICATIONS

Hunsche, Stefan et al., "A New Paradigm for In-Line Detection and Control of Patterning Defects", Metrology, Inspection, and Process Control for Microlithography, Proc. of SPIE, vol. 9424, 2015, pp. B-1-B-12.

Fuchimoto, Daisuke et al., "Measurement Technology to Quantify 2D Pattern Shape in Sub-2x nm Advanced Lithography", Metrology, Inspection, and Process Control for Microlithography, Proc. of SPIE, vol. 8681, 2013, pp. 36810A-1-86810A-7.

Wang, Yan et al., "A Simple and Practical Approach for Building Lithography Simulation Models Using a Limited Set of CD Data and SEM Pictures", Paper Abstract, Design for Manufacturability Through Design-Process Integration, SPIE, vol. 6521, Mar. 21, 2007, 2 pages.

*Primary Examiner* — Christopher G Young
(74) *Attorney, Agent, or Firm* — McDonnell Boehnen Hulbert & Berghoff LLP

(57) ABSTRACT

The disclosure is directed to a method for designing a lithographic mask to print a pattern of structural features, wherein an OPC-based methodology may be used for producing one or more simulated patterns as they would be printed through the optimized mask. A real mask is then produced according to the optimized design, and an actual print is made through the mask. To evaluate the printed pattern and the PW on wafer more accurately, experimental contours are extracted from the CD-SEM measurements of the printed pattern. The verification of the mask is based on a comparison between on the one hand the contour obtained from the printed pattern, and on the other hand the intended pattern and/or the simulated contour. A direct comparison can be made between simulation and experiment, without losing all the pieces of info contained in each single CD-SEM picture.

20 Claims, 3 Drawing Sheets

METHOD FOR DESIGNING A LITHOGRAPHIC MASK

CROSS-REFERENCE TO RELATED APPLICATIONS

The present application is a non-provisional patent application claiming priority to European Patent Application No. EP 15177048.4, filed Jul. 16, 2015, the contents of which are hereby incorporated by reference.

FIELD OF THE DISCLOSURE

The present disclosure relates to the design of lithographic masks used for the production of semiconductor devices.

BACKGROUND

A semiconductor device such as an integrated circuit chip is produced by a sequence of hundreds of process steps. Many of them require a lithographic mask through which a pattern is imprinted on a photoresist layer. The design of such lithographic masks nowadays involves the prediction of the printed pattern taking into account optical, resist and etch phenomena, which occur at the scale of the mask features and below. These effects cause unavoidable deviations on the printed pattern with respect to the design intent. So-called "Optical Proximity Correction" (OPC) and "Electronic Design Automation" (EDA) is used for determining and making corrections to the intended initial mask design to give the best possible approximation of the design intent on the printed wafer. OPC optimization is based on the fragmentation of the initial design edges to compensate for the given phenomena, and relies on an accurate modelling to predict simulated contours of the printed features. The review of the OPC-based solution is conducted by outputting a simulated "process window" (PW) of many features. A PW defines the printability performance limits in terms of the focus and dose settings of a lithographic printing tool, within which limits a reliable print of the pattern is obtainable. Some patterns can have bigger PW than other patterns, due to various reasons such as design geometry, accuracy of the OPC modelling, and more.

Primarily for the patterns showing the smallest PW, the simulated PW are subsequently verified experimentally by manufacturing the mask and using it to print the pattern on a plurality of die areas of a photosensitive resist layer. Each die area is being printed with varying values of the focus and dose conditions. The experimental PW are determined by measuring features on the plurality of die areas. Differences between the experimental and simulated PW are evaluated and may necessitate further OPC-based optimization of the mask design.

Different measurement techniques are known for analyzing the printed dies. CD-SEM (Critical Dimension-Scanning Electron Microscope) is used to measure the Critical Dimension (CD) of a number of pattern features on the printed dies. Because of the characteristics of the measurement technique, only specific feature types can be measured, such as regular line/space widths and distances between opposite line ends. This means that the features that are most critical, according to the OPC model, and presenting the most complex geometry can often not be measured. This is particularly true considering logic structures, which have complex 2D geometries and are not regularly distributed. The PW obtained in this way does not look at the most likely positions to fail (near corners, specific line-ends, etc.). Also this technique measures only a handful of positions since measurement boxes need to be placed manually. Another technique is known as PWQ (Process Window Quantification), wherein all dies are scanned with an optical microscope to detect differences with respect to a reference die. Defects (deviations from the reference) can then be reviewed by a dedicated SEM tool. The main drawback here is the resolution, limited by the optical microscope technique, that does not allow a retrieval of meaningful quantitative data when compared to the CD-SEM technique. As OPC modelling is nowadays being tuned down to the nm-level, this is not accurate enough to assess the model and OPC quality.

As the dimensions of printed features decrease with the evolution towards sub 32 nm nodes in semiconductor processing, the criticality of the above-described design and inspection processes becomes ever greater.

SUMMARY

An example embodiment includes a method for designing a lithographic mask. The method is disclosed in the appended claims. Another example embodiment further includes a method for designing a lithographic mask to print a pattern of structural features, wherein an OPC-based methodology may be used for producing one or more simulated patterns as they would be printed through the optimized mask. A real mask is then produced according to the optimized design, and an actual print is made through the mask. To evaluate the printed pattern and the PW on wafer more accurately, experimental contours are extracted from the CD-SEM measurements of the printed pattern. The verification of the mask is based on a comparison between on the one hand the contour obtained from the printed pattern, and on the other hand the intended pattern and/or the simulated contour. A direct comparison can be made between simulation and experiment, without losing all the pieces of info contained in each single CD-SEM picture.

One example method for designing a lithographic mask described herein and presented in the figures includes providing an intended pattern that includes a plurality of structural features. The plurality of structural features is characterized by one or more numerical parameters related to a shape or a position of the structural features. The method also includes producing a mask design of a lithographic mask suitable for printing the intended pattern and one or more simulated patterns printed through the mask design. The method further includes producing a lithographic mask according to the mask design. Additionally, the method includes printing a pattern through the lithographic mask produced according to the mask design. Still further, the method includes performing a verification of the printed pattern. Performing the verification of the printed pattern includes determining contours of at least a portion of the structural features in the printed pattern. Performing the verification of the printed pattern further includes determining, on the contours, values of the one or more numerical parameters and comparing the values of the one or more numerical parameters on the contours to values of the one or more numerical parameters in the intended pattern or to values of the one or more numerical parameters in one or more of the simulated patterns.

From the above-named method steps, it is clear that the wording "designing a mask" in the context of this description may equally be worded as "providing a mask design based on a design intent, manufacturing a mask and verifying said manufactured mask by verifying a printed pattern".

According to another embodiment, producing the mask design and the one or more simulated patterns includes determining a process window in terms of a focus and a dose value to be applied in a lithographic tool used for printing the pattern through the lithographic mask. The process window defines the limits between which the focus and the dose values can vary without at least some of the numerical parameters of the simulated pattern differing beyond a pre-defined degree from the intended pattern. Further, performing the verification of the printed pattern includes determining the process window on a plurality of printed patterns. Each of the printed patterns is printed by applying a different combination of focus and dose values. Determining the process window includes determining contours of at least a portion of the structural features in the printed pattern. Determining the process window additionally includes determining, on the contours, values of the one or more numerical parameters and comparing the values of the one or more numerical parameters on the contours to values of the one or more numerical parameters in the intended pattern or to values of the one or more numerical parameters in one or more of the simulated patterns.

According to another embodiment, the structural features include one or more line-shaped features. The one or more numerical parameters include at least one line-end position.

According to another embodiment, the method further includes verifying a line-end position by determining a shortest distance between a contour of a printed line-end and an intended line-end or between a contour of the printed line-end and a simulated line-end.

According to another embodiment, the one or more numerical parameters further include at least one line width or at least one distance between adjacent line-shaped features.

According to another embodiment, the one or more numerical parameters are derived from one or more contours by an automated image processing method.

According to another embodiment, the method further includes (i) updating the mask design on the basis of the verification of the printed pattern. The method also includes (ii) producing an additional lithographic mask according to the updated mask design. The method additionally includes (iii) printing a pattern through the additional mask. Still further, the method includes (iv) performing a verification of the pattern printed through the additional mask. In addition, the method includes repeating (i)-(iv) until the additional lithographic mask satisfies a pre-defined set of requirements. The requirements are defined in terms of the difference between the pattern printed through the additional mask and the intended pattern or at least one of the simulated patterns.

According to another embodiment, producing a mask design suitable for printing the intended pattern and producing one or more simulated patterns printed through the mask design are performed using a software tool for optical proximity correction.

According to another embodiment, determining, on the contours, the values of the one or more numerical parameters and comparing the values of the one or more numerical parameters on the contours to values of the one or more numerical parameters in the intended pattern or to values of the one or more numerical parameters in one or more of the simulated patterns are performed using the software tool for optical proximity correction to verify the contours.

According to another embodiment, determining the contours of at least a portion of the structural features in the printed pattern includes extracting the contours of at least a portion of the structural features in the printed pattern from Critical Dimension-Scanning Electron Microscope (CD-SEM) measurements.

In an additional example embodiment, a lithographic mask is described and presented in the figures. The lithographic mask is designed by a method. The method includes providing an intended pattern that includes a plurality of structural features. The plurality of structural features is characterized by one or more numerical parameters related to a shape or a position of the structural features. The method also includes producing a mask design of a lithographic mask suitable for printing the intended pattern and one or more simulated patterns printed through the mask design. The method further includes producing a lithographic mask according to the mask design. Additionally, the method includes printing a pattern through the lithographic mask produced according to the mask design. Still further, the method includes performing a verification of the printed pattern. Performing the verification of the printed pattern includes determining contours of at least a portion of the structural features in the printed pattern. Performing the verification of the printed pattern further includes determining, on the contours, values of the one or more numerical parameters and comparing the values of the one or more numerical parameters on the contours to values of the one or more numerical parameters in the intended pattern or to values of the one or more numerical parameters in one or more of the simulated patterns.

According to another embodiment, producing the mask design and the one or more simulated patterns includes determining a process window in terms of a focus and a dose value to be applied in a lithographic tool used for printing the pattern through the lithographic mask. The process window defines the limits between which the focus and the dose values can vary without at least some of the numerical parameters of the simulated pattern differing beyond a pre-defined degree from the intended pattern. Further, performing the verification of the printed pattern includes determining the process window on a plurality of printed patterns. Each of the printed patterns is printed by applying a different combination of focus and dose values. Determining the process window includes determining contours of at least a portion of the structural features in the printed pattern. Determining the process window additionally includes determining, on the contours, values of the one or more numerical parameters and comparing the values of the one or more numerical parameters on the contours to values of the one or more numerical parameters in the intended pattern or to values of the one or more numerical parameters in one or more of the simulated patterns.

According to another embodiment, the structural features include one or more line-shaped features. The one or more numerical parameters include at least one line-end position.

According to another embodiment, the method of designing the lithographic mask further includes verifying a line-end position by determining a shortest distance between a contour of a printed line-end and an intended line-end or between a contour of the printed line-end and a simulated line-end.

According to another embodiment, the one or more numerical parameters further include at least one line width or at least one distance between adjacent line-shaped features.

According to another embodiment, the one or more numerical parameters are derived from one or more contours by an automated image processing method.

According to another embodiment, the method of designing the lithographic mask further includes (i) updating the mask design on the basis of the verification of the printed pattern. The method also includes (ii) producing an additional lithographic mask according to the updated mask design. Still further, the method includes (iii) printing a pattern through the additional mask. Additionally, the method includes (iv) performing a verification of the pattern printed through the additional mask. Even further, the method includes repeating (i)-(iv) until the additional lithographic mask satisfies a pre-defined set of requirements. The requirements are defined in terms of the difference between the pattern printed through the additional mask and the intended pattern or at least one of the simulated patterns.

According to another embodiment, producing a mask design suitable for printing the intended pattern and producing one or more simulated patterns printed through the mask design are performed using a software tool for optical proximity correction.

According to another embodiment, determining, on the contours, the values of the one or more numerical parameters and comparing the values of the one or more numerical parameters on the contours to values of the one or more numerical parameters in the intended pattern or to values of the one or more numerical parameters in one or more of the simulated patterns are performed using the software tool for optical proximity correction to verify the contours.

According to another embodiment, determining the contours of at least a portion of the structural features in the printed pattern includes extracting the contours of at least a portion of the structural features in the printed pattern from Critical Dimension-Scanning Electron Microscope (CD-SEM) measurements.

DETAILED DESCRIPTION

Figure 1:
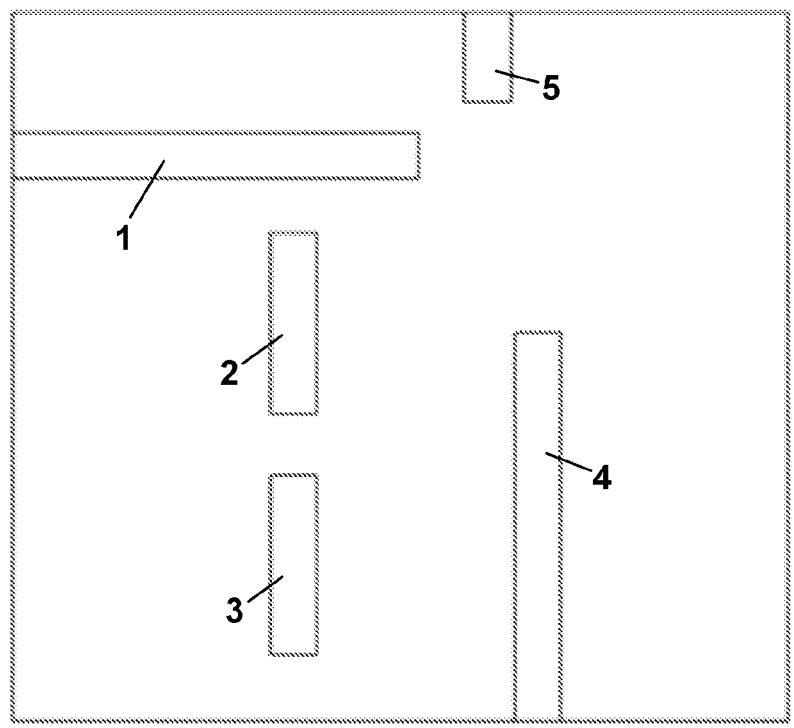
FIG. 1 illustrates a portion of a pattern that is to be printed by a lithographic tool. The figure shows the "design intent", i.e., the theoretical shape of the structural features of the pattern, according to example embodiments.

Example embodiments provided herein are explained in more detail on the basis of the accompanying drawings. FIG. 1 shows an example of an area of a pattern that is to be printed through a lithographic mask. The pattern comprises structural features in the form of elongate line-shaped polygons 1 through 5. A pattern of this type may for example be used for producing metal lines in a metallization layer, that is to be incorporated in the back-end-of-line stack (BEOL) of an integrated circuit chip, such as Metal 1 (i.e., 1st metal layer in the BEOL). The method may be applied on a printed pattern after litho as well as after etch. The pattern after litho is obtained after an exposure of a resist layer applied on the test wafer, through the litho-mask, and developing the resist layer, so that the exposed areas of the resist become visibly distinct from non-exposed areas. The pattern "after etch" is the pattern obtained after stripping of either the non-developed or developed areas of the resist, depending on the resist type used, and etching through a layer underlying the resist layer, using the remaining resist portions as an etch mask.

Figure 2:
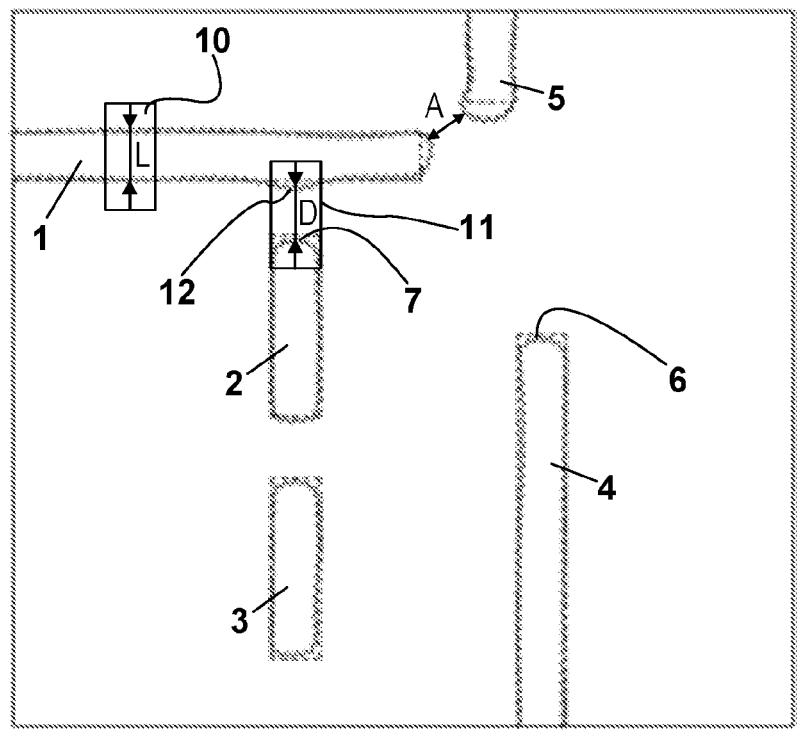
FIG. 2 illustrates the experimental printed pattern (i.e., a CD-SEM picture, symbolized by a zig-zag line), compared to the design intent (dotted line), according to example embodiments.

The drawing shows the theoretical outlines of the line features, referred to as the "design intent". A lithographic mask is designed and optimized so that the simulated pattern, i.e., the pattern simulated as it would be printed through the mask, matches as closely as possible the design intent. This optimization is typically a process performed by using software tools suitable for the above-referenced OPC as known in the art, provided by EDA vendors. Such software tools are referred to within the context of the present description as "software tools suitable for OPC" or "OPC (software) tools". Then the mask is manufactured according to the optimized design, and an actual print is made in a lithographic tool. FIG. 2 shows the printed pattern, as it will be given by any CD-SEM picture. The pattern is drawn with zig-zag type lines to indicate that the view of the pattern in FIG. 2 represents a CD-SEM image of the pattern. The printed pattern is seen to differ from the design intent superimposed in dotted lines on the pattern in FIG. 2.

The next step is the inspection and verification of the printed pattern by comparing it to the design intent and/or the simulated pattern. In practice, more than one simulated pattern is calculated, by simulating a variation of focus and dose conditions in order to determine a process window. Likewise, more than one print is made through the manufactured mask, by applying a variety of focus and dose settings in the lithographic tool. For the moment however, this description will focus on the individual verification of a single print condition of the pattern. The integration of the method into a process window methodology will be addressed further in this description.

As stated in the introduction, the method that is most widely used for the inspection of a printed pattern involves the measurement of a number of parameters on the printed pattern by CD-SEM. In particular, measurements are done in the vicinity of a number of locations that are identified as "hot-spots" during the verification process performed within the OPC optimization (i.e., verification of simulated patterns). These are areas in the pattern which are likely to be printed badly due to for example the size of the features, the proximity to other features, or the shape of the features. The problem when using CD-SEM for the wafer inspection process is that it is often not possible to measure the actual numerical parameters that define the hot-spots.

In the image shown in FIG. 2, four parameters may be of relevance for evaluating the quality of the print:
the width L of line feature 1
the minimum distance A between features 1 and 5
the position of the line-end 7 of feature 2
the position of the line-end 6 of feature 4

Not all of the above-named parameters can be measured by standard CD-SEM measurements. Such measurements are only possible when a horizontal or vertical distance is measured between two printing edges. CD-SEM measurements furthermore require manual placement of measurement boxes, which is not trivial, as illustrated in FIG. 2. The width L can be measured by normal CD-SEM, by placing a measurement box 10. The distance A cannot be directly measured by CD-SEM. Even with the placing of vertical and horizontal measurement boxes placed at each side of the 2 line-ends, the distance A cannot be determined accurately due to the complex shape arrangement of these 2 features. Apart from being a time-consuming process, manual placement of the boxes is a potential source of inaccuracy, especially in the case of the distance A.

The line-end position of line-end 7 of feature 2 can be derived from the measurement of the distance D between the line-end 7 and the surface of the line feature 1 opposite said line-end 7, by placement of a measurement box 11. However, determining the line-end position from a measured distance relies upon the assumption of a symmetrical printing behavior between the 2 opposite sites. So if a protrusion 12 exists on the feature 1, the measured distance will not give a correct indication of the position of line-end 7. Finally, the position of line-end 6 of feature 4 could be measured by using the line-end of the feature 5, which is oppositely shifted. However, the line-end position of feature 4 will not be accurately determined because of the distorted shape at the line-end of feature 5. The position of the line-end with respect to the design intent is commonly referred to as the line-end edge placement error (EPE).

Figure 3:
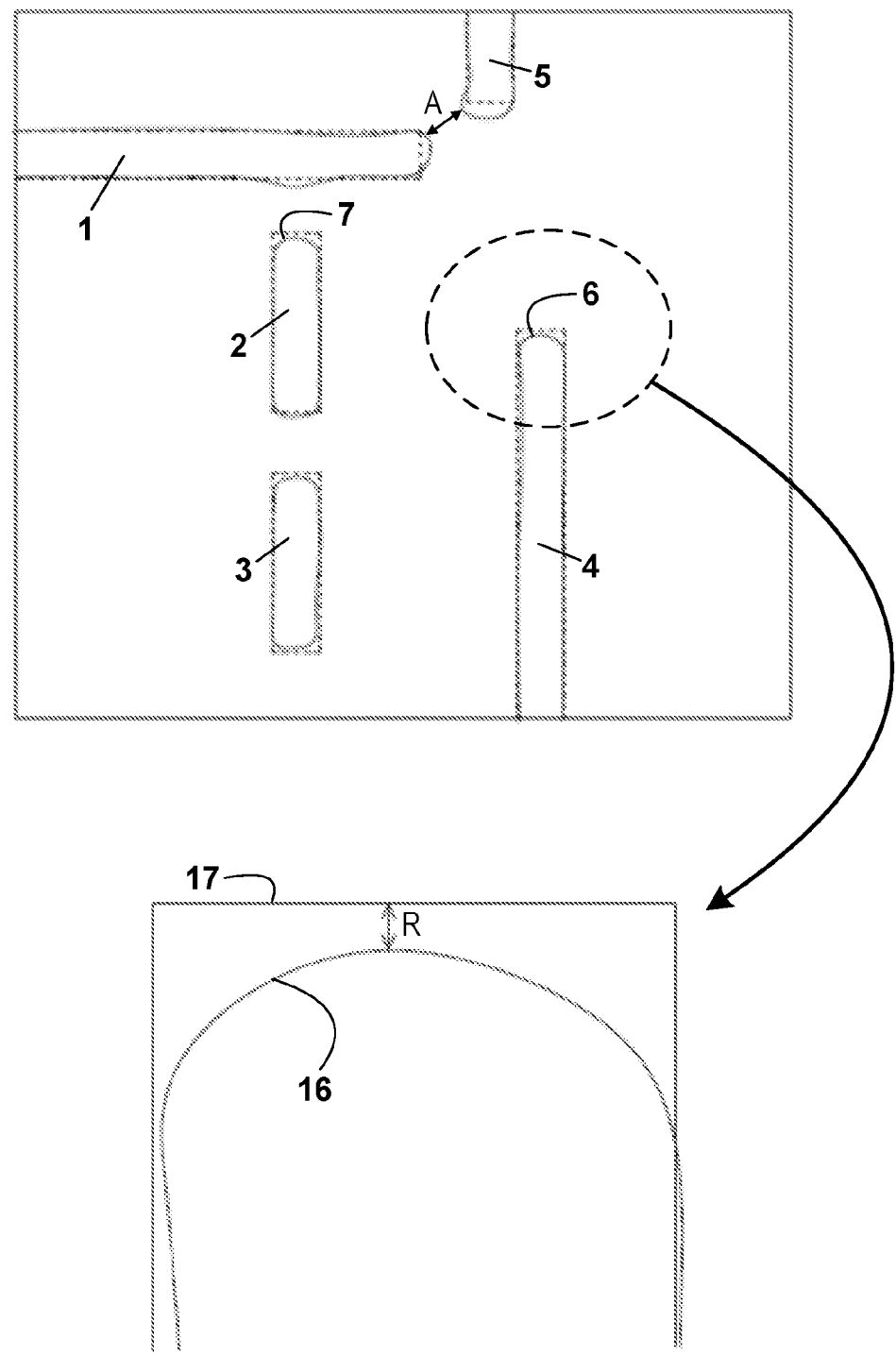
FIG. 3 illustrates a contour extracted from the CD-SEM image of the printed pattern, according to example embodiments.

In an example embodiment, the verification of the printed pattern is not based on individual CD-SEM measurements, but on a contour extracted from the printed pattern. Such contours are obtainable by dedicated software tools known in the art today, for example the DesignGauge® metrology system from Hitachi High Technology Corporation. Before making any assessment of the printed pattern, an image of the pattern or parts thereof is used as an input to such a tool for extracting the contour edges of the pattern. The extracted contour is illustrated in FIG. 3 (full line), in which the design intent (dotted line) is superimposed on the contour. The contour can then be evaluated in a more correct and complete manner than by isolated CD-SEM measurements.

The specific parameters identified above can be determined as follows on the basis of the contour:

the line width L can be measured by determining the distance between the parallel contour lines of line feature 1, possibly by averaging said distance measured at a plurality of locations along said parallel lines. The obtained value can be directly compared to the prescribed line width in the pattern according to the design intent.

the distance A can be measured by determining the minimum distance between the adjacent ends of line features 1 and 5. Rather than requiring the manual placement of measurement boxes, this may be achieved on the basis of an image processing tool which automatically draws the shortest possible distance A between the contours of features 1 and 5. The length of this line can be directly compared to the distance between the line ends in the pattern according to the design intent.

the position of line-end 6 can be found by determining the coordinates of the tip of the contour of the line-end 6 in a reference coordinate system, and comparing it to the coordinates of the tip of the line-end in the pattern according to the design intent. According to an embodiment, the comparison with the design intent is done by analyzing the contour directly with respect to the design intent, as illustrated in the detail of FIG. 3. An image processing tool can be applied to determine the minimum distance R between the contour 16 of line-end 6 and the intended position 17 of the line end.

the position of line-end 7 does not need to be determined on the basis of the distance with respect to the sidewall of the opposing line feature 1. This line-end 7 position can be compared directly to the intended position, in the same manner as described above for line-end 6.

The contour obtained from the printed pattern thus allows to verify parameters that are not verifiable by standard CD-SEM measurements, in particular the line-end position parameter as defined above, and the minimum distance A in the complex configuration involving features 1 and 5. Parameters can thus be verified that are the most relevant for defining the print quality. Also, the accuracy is improved given that manual placement of measurement boxes is no longer required, but parameters can be derived more accurately on the basis of image processing methods. The verification process can be automated, by identifying the required parameters on the basis of the design intent, and obtaining the parameters from the contours by a number of pre-defined image processing steps as described above.

The verification on the basis of contours can be incorporated in existing methodologies for determining the process window in terms of focus and dose limits. Such methodologies are based on the repeated printing of the pattern on a test wafer, each print being performed with varying values of the focus or dose conditions applied in the lithography tool used for producing the prints. The printability in such a focus-modulated and/or dose-modulated (i.e., focus-exposure matrix) test wafer can be evaluated according to an example method, i.e., by determining for each print a contour and deriving a set of parameters of the type described above. For each print these parameters are compared to the parameters prescribed by the design intent, and the process window is determined by determining the limits of the focus and dose values, so that when the focus and dose are within these limits, all or a portion of the parameters are staying within a pre-determined allowable deviation (as defined by CD tolerances for example) from the intended pattern.

Figure 4:
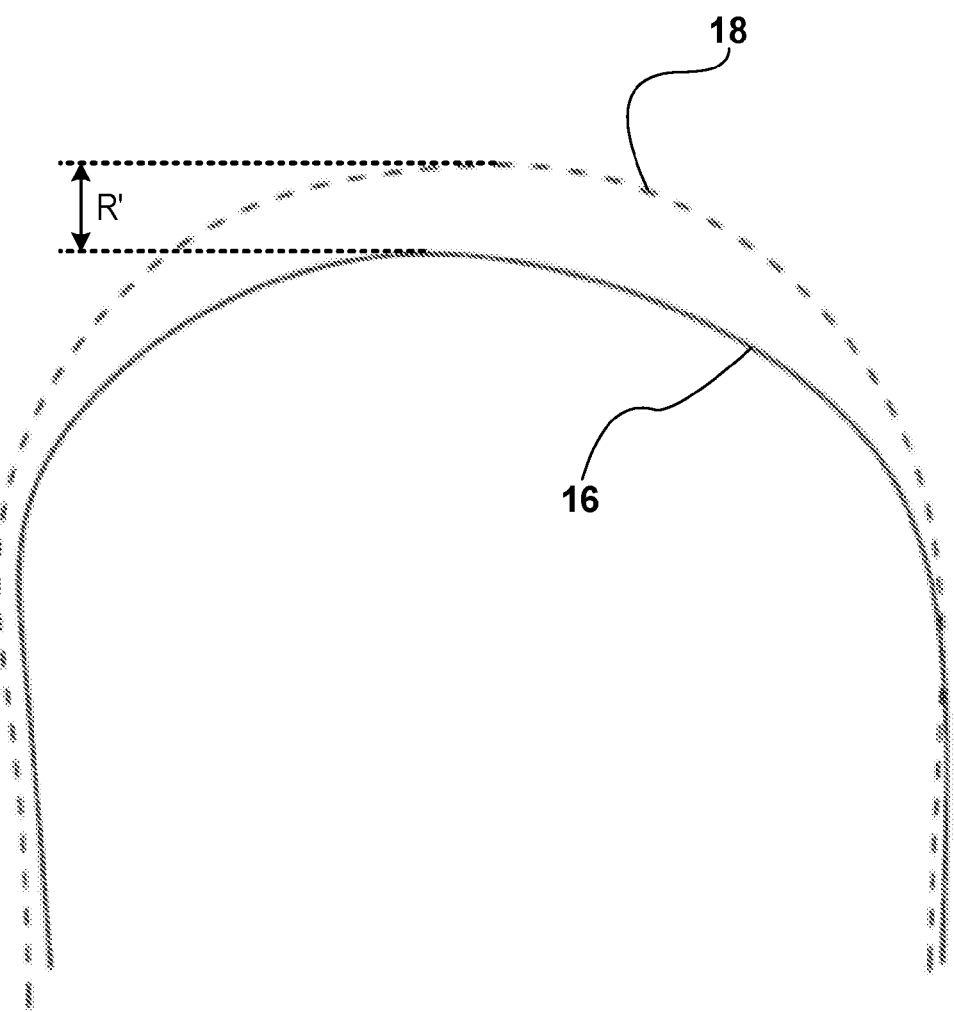
FIG. 4 illustrates the comparison between a contour extracted from a printed pattern and a simulated contour, according to example embodiments.

In the above description, the contour obtained from a printed pattern is consistently compared to the design intent. Alternatively or in addition to the comparison with the design intent, the verification step of the method may involve a direct comparison between a contour obtained from a printed pattern and a simulated pattern, i.e., on the contour of the pattern as it would be printed in a lithography tool with a given focus and dose setting. A simulated contour may be determined in the course of the OPC process and may be obtained in any manner known to the person skilled in the art of OPC tools and processes. Parameters like the line width, line-end position (i.e., line-end EPE) and distance between adjacent lines can be evaluated on the basis of a comparison to a simulated contour, in the same manner as described above on the basis of a comparison to the design intent. For example, and as illustrated in FIG. 4, the distance R' can be determined by image processing techniques, between the tip of the contour 16 of the line-end and the tip of the simulated contour 18 of the line-end. Printed patterns printed at various focus and dose settings may thus be compared to simulated patterns determined on the basis of the same focus and dose settings. For the purpose of determining the process window, printed contours with varying focus and dose settings may be compared to a simulated pattern with a fixed focus and dose setting.

The verification of one individual print or the verification of several prints to obtain the process window and compare said PW to the simulated process window may lead to the conclusion that either the manufactured mask is satisfactory, i.e., that the verified parameters and/or the process window are sufficiently close to parameters/PW derived from the design intent and/or a previously simulated pattern, or it may lead to the conclusion that the mask needs further updating, when the parameters and/or the process window are too far away from the design intent and/or from a previous simulation, due to the quality of the OPC modelling, or the printing processing operation steps for example. If the mask needs further updating, the updating is done in a further optimization, typically a further OPC type optimization of the mask design, leading to the manufacture of a second mask, and the verification of printed patterns in the same way as described above. In other words, steps described above can be iterated any number of times until the verification step yields a satisfactory mask for being used in high volume manufacturing.

According to an embodiment, the verification step can include the evaluation of the contour extracted from the printed pattern by an OPC software tool as known in the art, i.e., by evaluating the measured contour as if it is a simulated contour, by applying any evaluation capability included in such a software tool to the extracted contour. This means that the OPC tool used for designing the mask may also be used for verifying the printed pattern. One of the capabilities of the OPC tool is the application of an automated verification script. Previously, such automated scripts were only performed on simulated contours. According to the latter embodiment, such scripts may be applied to contours obtained from CD-SEM images of actually printed patterns (post-litho or post etch). This allows to make a direct comparison between simulation and experiment, without losing information contained in each single CD-SEM image.

While example embodiments have been illustrated and described in detail in the drawings and foregoing description, such illustration and description are to be considered illustrative or exemplary and not restrictive. Other variations to the disclosed embodiments can be understood and effected by those skilled in the art in practicing the claims, from a study of the drawings, the disclosure and the appended claims. In the claims, the word "comprising" does not exclude other elements or steps, and the indefinite article "a" or "an" does not exclude a plurality. The mere fact that certain features are recited in mutually different dependent claims does not indicate that a combination of these measures cannot be used to advantage. Any reference signs in the claims should not be construed as limiting the scope.

What is claimed is:

1. A method for designing a lithographic mask, comprising:
    providing an intended pattern comprising a plurality of structural features, wherein the plurality of structural features is characterized by one or more numerical parameters related to a shape or a position of the structural features;
    producing a mask design of a lithographic mask suitable for printing the intended pattern and one or more simulated patterns printed through the mask design;
    producing a lithographic mask according to the mask design;
    printing a pattern through the lithographic mask produced according to the mask design; and
    performing a verification of the printed pattern, wherein performing the verification of the printed pattern comprises:
        determining contours of at least a portion of the structural features in the printed pattern; and
        determining, on the contours, values of the one or more numerical parameters and comparing the values of the one or more numerical parameters on the contours to values of the one or more numerical parameters in the intended pattern or to values of the one or more numerical parameters in one or more of the simulated patterns.

2. The method according to claim 1, wherein producing the mask design and the one or more simulated patterns comprises determining a process window in terms of a focus and a dose value to be applied in a lithographic tool used for printing the pattern through the lithographic mask, wherein the process window defines the limits between which the focus and the dose values can vary without at least some of the numerical parameters of the simulated pattern differing beyond a pre-defined degree from the intended pattern, and wherein performing the verification of the printed pattern further comprises:
    determining the process window on a plurality of printed patterns, wherein each of the printed patterns is printed by applying a different combination of focus and dose values, and wherein determining the process window comprises:
        determining contours of at least a portion of the structural features in the printed pattern; and
        determining, on the contours, values of the one or more numerical parameters and comparing the values of the one or more numerical parameters on the contours to values of the one or more numerical parameters in the intended pattern or to values of the one or more numerical parameters in one or more of the simulated patterns; and
    comparing the process window determined for the lithographic tool with the process window determined for the plurality of printed patterns.

3. The method according to claim 1, wherein the structural features comprise one or more line-shaped features, and wherein the one or more numerical parameters comprise at least one line-end position.

4. The method according to claim 3, further comprising verifying a line-end position by determining a shortest distance between a contour of a printed line-end and an intended line-end or between a contour of the printed line-end and a simulated line-end.

5. The method according to claim 3, wherein the one or more numerical parameters further comprise at least one line width or at least one distance between adjacent line-shaped features.

6. The method according to claim 1, wherein the one or more numerical parameters are derived from one or more contours by an automated image processing method.

7. The method according to claim 1, further comprising:
    (i) updating the mask design on the basis of the verification of the printed pattern;
    (ii) producing an additional lithographic mask according to the updated mask design;
    (iii) printing a pattern through the additional mask;
    (iv) performing a verification of the pattern printed through the additional mask; and
    repeating (i)-(iv) until the additional lithographic mask satisfies a pre-defined set of requirements, wherein the requirements are defined in terms of the difference between the pattern printed through the additional mask and the intended pattern or at least one of the simulated patterns.

8. The method according to claim 1, wherein producing a mask design suitable for printing the intended pattern and producing one or more simulated patterns printed through the mask design are performed using a software tool for optical proximity correction.

9. The method according to claim 8, wherein determining, on the contours, the values of the one or more numerical parameters and comparing the values of the one or more numerical parameters on the contours to values of the one or more numerical parameters in the intended pattern or to values of the one or more numerical parameters in one or more of the simulated patterns are performed using the software tool for optical proximity correction to verify the contours.

10. The method according to claim 1, wherein determining the contours of at least a portion of the structural features in the printed pattern comprises extracting the contours of at least a portion of the structural features in the printed pattern from Critical Dimension-Scanning Electron Microscope (CD-SEM) measurements.

11. A lithographic mask, wherein the lithographic mask is designed by a method comprising:
providing an intended pattern comprising a plurality of structural features, wherein the plurality of structural features is characterized by one or more numerical parameters related to a shape or a position of the structural features;
producing a mask design of a lithographic mask suitable for printing the intended pattern and one or more simulated patterns printed through the mask design;
producing a lithographic mask according to the mask design;
printing a pattern through the lithographic mask produced according to the mask design; and
performing a verification of the printed pattern, wherein performing the verification of the printed pattern comprises:
determining contours of at least a portion of the structural features in the printed pattern; and
determining, on the contours, values of the one or more numerical parameters and comparing the values of the one or more numerical parameters on the contours to values of the one or more numerical parameters in the intended pattern or to values of the one or more numerical parameters in one or more of the simulated patterns.

12. The lithographic mask according to claim 11, wherein producing the mask design and the one or more simulated patterns comprises determining a process window in terms of a focus and a dose value to be applied in a lithographic tool used for printing the pattern through the lithographic mask, wherein the process window defines the limits between which the focus and the dose values can vary without at least some of the numerical parameters of the simulated pattern differing beyond a pre-defined degree from the intended pattern, and wherein performing the verification of the printed pattern further comprises:
determining the process window on a plurality of printed patterns, wherein each of the printed patterns is printed by applying a different combination of focus and dose values, and wherein determining the process window comprises:
determining contours of at least a portion of the structural features in the printed pattern; and
determining, on the contours, values of the one or more numerical parameters and comparing the values of the one or more numerical parameters on the contours to values of the one or more numerical parameters in the intended pattern or to values of the one or more numerical parameters in one or more of the simulated patterns; and
comparing the process window determined for the lithographic tool with the process window determined for the plurality of printed patterns.

13. The lithographic mask according to claim 11, wherein the structural features comprise one or more line-shaped features, and wherein the one or more numerical parameters comprise at least one line-end position.

14. The lithographic mask according to claim 13, wherein the method of designing the lithographic mask further comprises verifying a line-end position by determining a shortest distance between a contour of a printed line-end and an intended line-end or between a contour of the printed line-end and a simulated line-end.

15. The lithographic mask according to claim 13, wherein the one or more numerical parameters further comprise at least one line width or at least one distance between adjacent line-shaped features.

16. The lithographic mask according to claim 11, wherein the one or more numerical parameters are derived from one or more contours by an automated image processing method.

17. The lithographic mask according to claim 11, wherein the method of designing the lithographic mask further comprises:
(i) updating the mask design on the basis of the verification of the printed pattern;
(ii) producing an additional lithographic mask according to the updated mask design;
(iii) printing a pattern through the additional mask;
(iv) performing a verification of the pattern printed through the additional mask; and
repeating (i)-(iv) until the additional lithographic mask satisfies a pre-defined set of requirements, wherein the requirements are defined in terms of the difference between the pattern printed through the additional mask and the intended pattern or at least one of the simulated patterns.

18. The lithographic mask according to claim 11, wherein producing a mask design suitable for printing the intended pattern and producing one or more simulated patterns printed through the mask design are performed using a software tool for optical proximity correction.

19. The lithographic mask according to claim 18, wherein determining, on the contours, the values of the one or more numerical parameters and comparing the values of the one or more numerical parameters on the contours to values of the one or more numerical parameters in the intended pattern or to values of the one or more numerical parameters in one or more of the simulated patterns are performed using the software tool for optical proximity correction to verify the contours.

20. The lithographic mask according to claim 11, wherein determining the contours of at least a portion of the structural features in the printed pattern comprises extracting the contours of at least a portion of the structural features in the printed pattern from Critical Dimension-Scanning Electron Microscope (CD-SEM) measurements.

* * * * *